United States Patent [19]
Latchford et al.

[11] Patent Number: 5,160,407
[45] Date of Patent: Nov. 3, 1992

[54] LOW PRESSURE ANISOTROPIC ETCH PROCESS FOR TANTALUM SILICIDE OR TITANIUM SILICIDE LAYER FORMED OVER POLYSILICON LAYER DEPOSITED ON SILICON OXIDE LAYER ON SEMICONDUCTOR WAFER

[75] Inventors: Ian S. Latchford, Cupertino, Calif.; Patrica Vasquez, Milan, Italy; David J. Hemker, Sunnyvale, Calif.; Brigitte Petit, Varces, France

[73] Assignee: Applied Materials, Inc., Santa Clara, Calif.

[21] Appl. No.: 636,867

[22] Filed: Jan. 2, 1991

[51] Int. Cl.$^5$ .............................................. H01L 21/00
[52] U.S. Cl. .................................... 156/656; 156/643; 156/646; 156/662; 156/664
[58] Field of Search ............... 156/643, 646, 662, 664, 156/656

[56] References Cited

U.S. PATENT DOCUMENTS

| | | | |
|---|---|---|---|
| 4,473,436 | 9/1984 | Beinvogl | 156/656 |
| 4,668,338 | 5/1987 | Maydan et al. | 156/643 |
| 4,778,563 | 10/1988 | Stone | 252/79.2 |
| 4,784,720 | 11/1988 | Douglas | 156/643 |
| 4,785,962 | 11/1988 | Toshima | 220/260 |
| 4,842,683 | 6/1989 | Cheng et al. | 156/345 |
| 4,844,767 | 7/1989 | Okudaira et al. | 156/345 |
| 4,951,601 | 8/1990 | Maydan et al. | 118/719 |
| 5,007,982 | 4/1991 | Tsou | 156/659.1 |
| 5,021,121 | 6/1991 | Groechel et al. | 156/643 |
| 5,035,768 | 7/1991 | Mu et al. | 156/643 |
| 5,036,590 | 7/1991 | Amini et al. | 437/228 |

OTHER PUBLICATIONS

"Precision 5000 Etch: Tungsten Silicide Process Capability"; Etch News Bulletin; Applied Materials, Inc.; vol. VII; No. 1, Spring 1990.

L. Y. Tsou; "Highly Selective Reactive Ion Etching of Polysilicon with Hydrogen Bromide"; J.E.S. Oct. 1989; vol. 136; No. 10; abstract (only).

Primary Examiner—Brian E. Hearn
Assistant Examiner—George Goudreau
Attorney, Agent, or Firm—John P. Taylor

[57] ABSTRACT

A low pressure process is described for the anisotropic etching of a titanium or tantalum silicide layer formed over a polysilicon layer on a gate oxide layer, and then masked. The etch process is carried out at a low pressure of about 10 milliTorr to about 30 milliTorr using $Cl_2$ and HBr etching gases, preferably only $Cl_2$ at the etching gas, to etch the silicide without undercutting the mask layer. In a preferred embodiment, etch residues are also eliminated by the use of only $Cl_2$ as the etching gas in the low pressure etch step. In the most prefferred embodiment, any bulges which might otherwise remain in the sidewalls of the underlying polysilicon layer, are also eliminated by using only HBr as the etching gas in the over-etch step, which is highly selective to oxide to protect the underlying gate oxide layer; resulting in an anisotropic etch of both the titanium/tantalum silicide and polysilicon layers, without leaving etch residues on the wafer surface.

9 Claims, 2 Drawing Sheets

---

ANISOTROPICALLY ETCHING A TITANIUM SILICIDE OR TANTALUM SILICIDE LAYER FORMED ON A POLYSILICON LAYER DEPOSITED OVER A GATE OXIDE ON A SEMICONDUCTOR WAFER USING A LOW PRESSURE RANGING FROM ABOUT 10 TO ABOUT 30 MILLITORR WHILE PREFERABLY FLOWING ONLY CHLORINE ETCHING GAS INTO THE CHAMBER IN A PLASMA-ASSISTED FIRST ETCHING STEP USING A PLASMA POWER RANGING FROM ABOUT 200 TO ABOUT 400 WATTS AND WHILE OPTIONALLY IMMERSING THE WAFER IN A MAGNETIC FIELD OF FROM 0 TO ABOUT 125 GAUSS

ETCHING THE POLYSILICON LAYER IN A SECOND ETCH STEP SELECTIVE TO OXIDE TO PROTECT THE UNDERLYING GATE OXIDE USING ONLY HBr AS THE ETCHING GAS

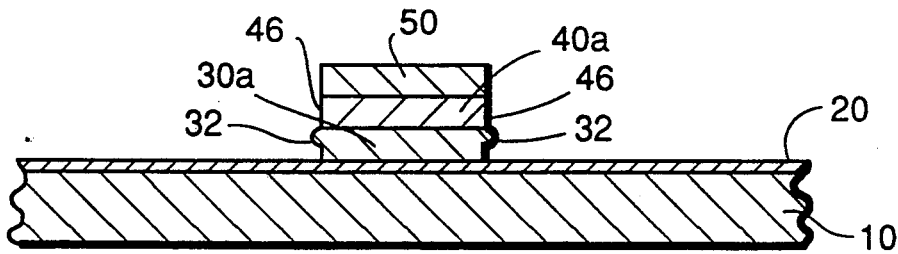

Figure 5

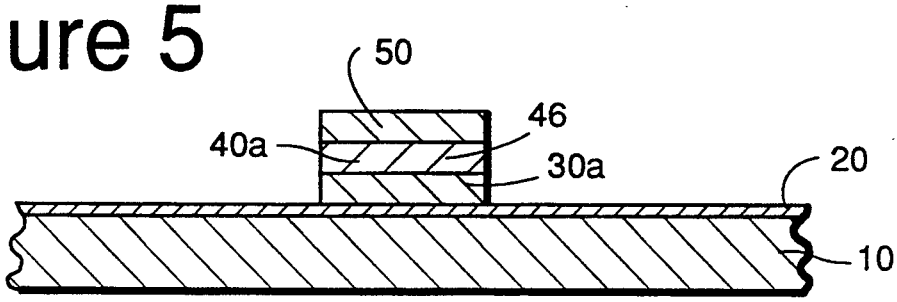

Figure 6

ANISOTROPICALLY ETCHING A TITANIUM SILICIDE OR TANTALUM SILICIDE LAYER FORMED ON A POLYSILICON LAYER DEPOSITED OVER A GATE OXIDE ON A SEMICONDUCTOR WAFER USING A LOW PRESSURE RANGING FROM ABOUT 10 TO ABOUT 30 MILLITORR WHILE PREFERABLY FLOWING ONLY CHLORINE ETCHING GAS INTO THE CHAMBER IN A PLASMA-ASSISTED FIRST ETCHING STEP USING A PLASMA POWER RANGING FROM ABOUT 200 TO ABOUT 400 WATTS AND WHILE OPTIONALLY IMMERSING THE WAFER IN A MAGNETIC FIELD OF FROM 0 TO ABOUT 125 GAUSS

ETCHING THE POLYSILICON LAYER IN A SECOND ETCH STEP SELECTIVE TO OXIDE TO PROTECT THE UNDERLYING GATE OXIDE USING ONLY HBr AS THE ETCHING GAS

Figure 7

LOW PRESSURE ANISOTROPIC ETCH PROCESS FOR TANTALUM SILICIDE OR TITANIUM SILICIDE LAYER FORMED OVER POLYSILICON LAYER DEPOSITED ON SILICON OXIDE LAYER ON SEMICONDUCTOR WAFER

BACKGROUND OF THE INVENTION

1. Field of the Invention

This invention relates to a process for etching tantalum silicide or titanium silicide materials on semiconductor wafers. More particularly, this invention relates to an improved process for anisotropically etching a tantalum silicide or titanium silicide layer previously formed over a polysilicon layer deposited on a silicon oxide surface on a semiconductor wafer.

2. Description of the Related Art

Conventional anisotropic etching of materials such as polysilicon, applied over an insulation layer such as silicon oxide on a semiconductor wafer, is usually carried out by first using a mixture of $HBr/Cl_2$ gases at a pressure of about 100 milliTorr in a plasma-assisted main etching step. This first etch step serves to rapidly remove the polysilicon, but is not very selective with respect to the etching of polysilicon versus silicon oxide. As the etch proceeds to a point where silicon oxide might be exposed and etched, the main etch is stopped and replaced by an overetch step, using a mixture of $HBr/Cl_2/He/O_2$ gases at a lower plasma power level. This overetch step is more selective to silicon oxide, i.e., will preferably etch polysilicon rather than oxide by a ratio of about 50:1.

Conductive polysilicon interconnects or lines between active devices of integrated circuit structures on a semiconductor wafer have been formed, in the past, by carrying out the above described etching steps on a previously applied polysilicon layer.

More recently, however, as line widths have become smaller, it has been proposed to provide a metal silicide coating, such as a tantalum silicide or a titanium silicide layer, over the polysilicon to increase the conductivity of such interconnects or lines.

Thus, instead of forming only a polysilicon layer over an integrated circuit structure on a semiconductor wafer, followed by patterning of the layer by masking and etching the polysilicon layer, a layer of titanium or tantalum is applied over the polysilicon layer followed by a siliciding step. Then the dual layer of metal silicide/polysilicon is masked and then anisotropically etched.

However, when the above described etching process steps for polysilicon are applied to the anisotropic etching of a dual layer of silicide and polysilicon, the overlying silicide layer is sometimes undercut.

As shown in FIG. 1, a silicon substrate 10 is provided with a thin gate oxide layer 20 over which is deposited a polysilicon layer 30. A layer of tantalum or titanium is then deposited over polysilicon layer 30 and heated to form silicide layer 40 over polysilicon layer 30. A photoresist mask 50 is then applied over silicide layer 40.

When the previously described conventional prior art etching process is then applied to the dual layer of metal silicide and polysilicon, the main etch step can result in an undercutting of the sidewalls of the remaining portion 40a of silicide layer 40, as shown at 42 in prior art FIG. 2. Furthermore, use of the above described overetch step may result in a bulging out of the sidewalls of underlying unetched polysilicon portion 30a below silicide portion 40a and photoresist mask 50, as shown at 32 in FIG. 3. In addition, use of the prior art main etch step can result in etch residues 70 such as, for example, silicide residues which remain on silicon oxide layer 20 upon completion of the two prior art etch steps. Thus, the desired anisotropic etch of both the silicide and underlying polysilicon layers is not always achievable using the conventional prior art etching methods.

SUMMARY OF THE INVENTION

In one embodiment, the invention comprises a process for anisotropically etching a tantalum silicide or titanium silicide layer without undercutting the mask using a plasma-assisted low pressure $Cl_2$ and HBr main etch.

In another embodiment, the invention comprises a process for anisotropically etching a tantalum silicide or titanium silicide layer without undercutting the mask and without leaving any etch residues after the overetch step, using a plasma-assisted low pressure main etch, with only $Cl_2$ used as the etching gas, followed by an overetch step using a plasma-assisted etch with a $Cl_2/HBr/He/O_2$ gas mixture.

In yet another embodiment, the invention comprises a process for anisotropically etching a tantalum silicide or titanium silicide layer without undercutting the mask, without leaving any etch residues after the overetch step, and without leaving bulges in the underlying polysilicon layer, using a plasma-assisted low pressure main etch, with only $Cl_2$ used as the etching gas, followed by an overetch step using a plasma-assisted etch with only HBr used as the etching gas.

Other aspects of the invention will become apparent from the following description and accompanying drawings.

BRIEF DESCRIPTION OF THE DRAWINGS

FIG. 5 is a fragmentary side-section view of the structure of FIG. 1 after being subjected to the low pressure plasma-assisted main etch of the invention, using only $Cl_2$ gas.

FIG. 6 is a fragmentary side-section view of the structure of FIG. 1 after being subjected to the low pressure plasma-assisted main etch of the invention, using only $Cl_2$ etching gas; and the plasma-assisted overetch step of the invention which uses only HBr etching gas.

FIG. 7 is a flow sheet illustrating the most preferred embodiment of the titanium/tantalum silicide etch process of the invention.

DETAILED DESCRIPTION OF THE INVENTION

Figure 2:
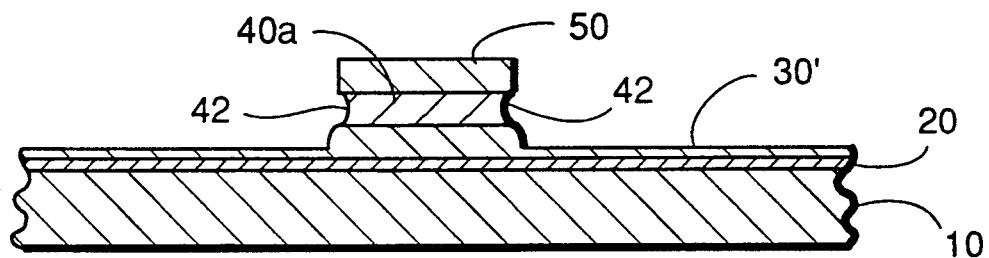
FIG. 2 is a fragmentary side-section view of the structure of FIG. 1 after being subjected to only the conventional prior art main etch, resulting in undercutting of the sidewalls of the silicide layer under the mask, with an exaggerated amount of polysilicon layer 30' shown as remaining after the main etch for illustrative purposes only.
Figure 3:
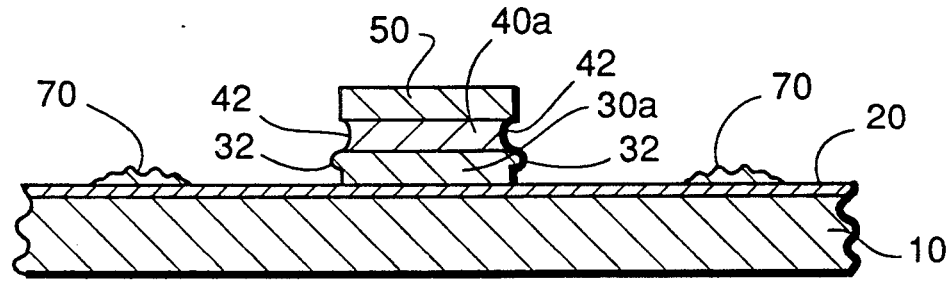
FIG. 3 is a fragmentary side-section view of the structure of FIG. 1 after being subjected to both the conventional prior art main etch, resulting in undercutting of the sidewalls of the silicide layer under the mask; and a conventional over-etch, resulting in bulges left in the polysilicon layer after the prior art over-etch step.

The low pressure silicide etch process of the invention permits anisotropic etching of a titanium or tantalum silicide layer formed over a polysilicon layer and then masked with a mask layer such as, for example, a photoresist mask, without undercutting of mask layer by over etching of the silicide layer as shown in prior art FIGS. 2 and 3. In a preferred embodiment, etch residues are also eliminated by the use of only $Cl_2$ as the etch gas in the low pressure main etch. In the most preferred embodiment, not only is the silicide layer anisotropically etched without leaving etch residues, but any bulges, which might otherwise remain in the sidewalls of the underlying polysilicon layer after the over-etch step, are eliminated by the use of only HBr as the etch gas in the over-etch step, resulting in an anisotropic etch of both the titanium/tantalum silicide and polysilicon layers, without ascertainable etch residues.

In the practice of the process of the invention, deposition and etching apparatus for semiconductor wafers capable of providing low pressure (high vacuum) is utilized such as described in Maydan et al. U.S. Pat. No. 4,951,601 and Toshima U.S. Pat. No. 4,785,962, both assigned to the assignee of this invention, and cross-reference to both of which is hereby made.

Figure 1:
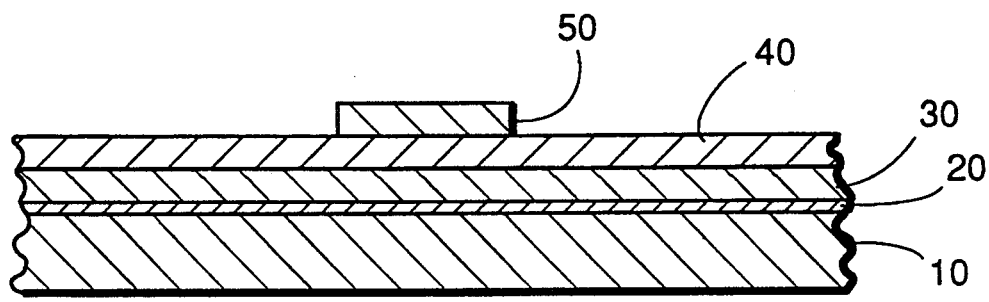
FIG. 1 is a fragmentary side-section view of a semiconductor wafer with a photoresist mask on a metal silicide layer formed on a polysilicon layer deposited over a silicon oxide layer on the wafer.

Using such apparatus, a silicon oxide layer 20 may be formed, for example as a gate oxide, over a substrate 10 comprising a silicon wafer, as shown in FIG. 1, which wafer may or may not have some integrated circuit structures already formed therein. A polysilicon layer 30, usually having a thickness ranging from about 2000 Angstroms to about 2500 Angstroms, is then deposited over oxide layer 20.

The titanium silicide or tantalum silicide may then be formed by deposition, onto the surface of polysilicon layer 30, of a titanium or tantalum layer thick enough to permit formation of the respective metal silicide layer, such as, for example, a titanium silicide layer ranging in thickness from about 1000 Angstroms to about 1500 Angstroms, or a tantalum silicide layer ranging from about 2000 Angstroms to about 2500 Angstroms. Such deposition of the tantalum or titanium metal usually will be by sputtering, but could be done by CVD techniques.

The structure is then typically heated to a temperature of about 600° C. for a period of about 80 seconds in a nitrogen atmosphere to cause the titanium or tantalum metal to react with the polysilicon to form silicide layer 40 over polysilicon layer 30.

Alternatively, titanium silicide or tantalum silicide layer 40 may be formed over polysilicon layer 30 by direct deposition using CVD techniques, it being understood that the manner in which titanium silicide or tantalum silicide layer 40 is formed over polysilicon layer 30 forms no part of the present invention.

The silicide/polysilicon layers are then patterned to form the desired wiring/interconnect structure by first applying a patterned mask layer 50 over silicide layer 40. Conventionally, mask layer 50 will comprise a photoresist material, but other mask materials may be used such as, for example, silicon nitride or silicon oxide mask materials.

In accordance with one embodiment of the process of the invention, the masked silicide/polysilicon layers are now etched in a vacuum chamber at a low pressure ranging from about 10 to about 30 milliTorr, preferably about 20 milliTorr. A flow of $Cl_2$ etching gas into the chamber is maintained during the etch at a flow rate range equivalent to from about 20 standard cubic centimeters/minute (sccm) to about 40 sccm into a 13 liter chamber. HBr may also be flowed into the chamber as an etching gas within the same equivalent flow rate range, i.e., at a flow rate range equivalent to from about 20 standard cubic centimeters/minute (sccm) to about 40 sccm into a 13 liter chamber. Non-etching gases or additives, e.g., argon, helium or nitrogen, may optionally be included in the gas flow into the vacuum chamber in amounts of up to as much as 70 volume % of the total gas flow into the vacuum chamber.

The temperature of the wafer is maintained within a range of from about 18° C. to about 100° C., preferably higher than 40° C. up to about 75° C., and usually about 65° C., by, for example, appropriate heating or cooling of the wafer support on which the wafer is mounted during the etch steps.

The main etch is carried out while maintaining a plasma in the chamber between the wafer support (cathode) and the grounded walls of the chamber (anode) at a power level range equivalent to a range of from about 200 watts to about 400 watts in a 13 liter vacuum chamber.

The main etch is carried out for a period of time ranging from about 30 seconds to about 90 seconds, preferably from about 70 to about 85 seconds, and most preferably from about 75 to about 80 seconds, typically about 78 seconds.

The main etch may be optionally carried out while immersing the wafer in a magnetic field having its magnetic axis parallel to the plane of the wafer using apparatus such as described and claimed in Maydan et al. U.S. Pat. No. 4,668,338 and Cheng et al. U.S. Pat. No. 4,842,683, both assigned to the assignee of this invention, and cross-reference to both of which is hereby made. The strength of the optional magnetic field may range from 0 to about 125 gauss, but will preferably range from about 30 gauss to about 125 gauss. Immersion of the wafer in a magnetic field during the etch will not affect the profile of the etch, but can prevent or mitigate damage to the wafer by the etch, as well as provide more uniformity of the etch across the surface of the wafer.

Figure 4:
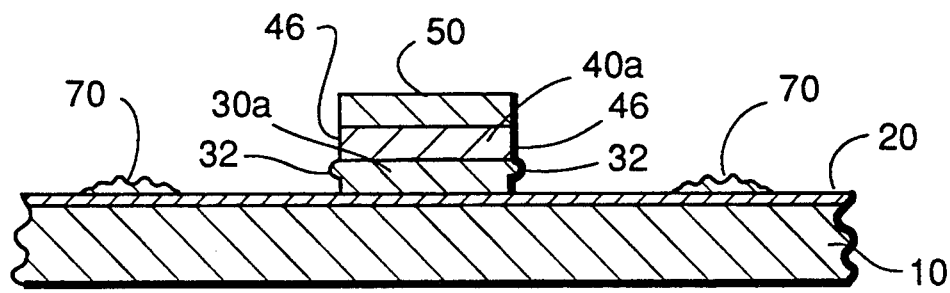
FIG. 4 is a fragmentary side-section view of the structure of FIG. 1 after being subjected to the low pressure plasma-assisted main etch of the invention, using both $Cl_2$ and HBr gases.

As shown in FIG. 4 at 46, the resultant etch of silicide layer 40 is an anisotropic etch of the silicide with no undercutting of the silicide below mask 50. After completion of the main etch step, which etches away substantially all of the unmasked silicide, as well as a portion of the underlying polysilicon layer, the etch conditions are changed to provide etch conditions with a higher selectivity to oxide, referred to as an over-etch.

In this embodiment of the invention, the over-etch step may be carried out using typical prior art over-etch conditions of about 100 milliTorr pressure, plasma power equivalent to 150 watts in a 13 liter chamber, and 75 gauss magnetic field strength, for a period of about 100 seconds while flowing $Cl_2$, HBr, He, and $O_2$ into the etch chamber at rates equivalent to the flow into a 13 liter chamber of about 30 sccm $Cl_2$, about 30 sccm HBr, and about 6 sccm of a mixture of $He/O_2$ gases containing about 70 volume % helium and about 30 volume % O$_2$. This will provide the desired high selectivity to oxide, wherein polysilicon will be etched at a rate of about 50 times the etch rate of oxide, to protect the underlying gate oxide layer from being etched away.

While the above described etch process results in an anisotropic etch of the tantalum silicide or titanium silicide layer, as shown in FIG. 4, without the undercutting of the silicide found in prior art etch processes, it has been noted that some etch residues 70 still remain on the structure after the main etch step which are not removed during the over-etch step, as shown in FIG. 4.

Therefore, in accordance with a preferred embodiment of the invention, the main etch step of the invention is carried out under the low pressure conditions just described for the previous embodiment, including the described time, temperature, plasma power, and magnetic field density ranges, but with the omission of HBr etching gas from the gas stream flowing into the etching chamber during the main etch. That is, the identical etch conditions are used, but with only Cl$_2$ flowed into the etch chamber as an etch gas, within the previously described equivalent flow rate ranges, i.e., at a flow rate range equivalent to from about 20 standard cubic centimeters/minute (sccm) to about 40 sccm into a 13 liter chamber.

It should be pointed out, however, that while Cl$_2$ is the only etch gas flowed into the vacuum chamber, in this embodiment, during the main etch, non-etching gases or additives, e.g., argon, helium or nitrogen, may optionally be included in the gas flow into the vacuum chamber in amounts of up to as much as 70 volume % of the total gas flow into the vacuum chamber, as described with respect to the previous embodiment.

The result, as shown in FIG. 5, is a structure free of etch residues remaining on the surface of the semiconductor wafer structure after completion of the novel main etch step of the invention as well as the conventional over-etch step.

However, in both of the process embodiments of the invention just described, as shown respectively in FIGS. 4 and 5, the underlying polysilicon layer 30 may not be anisotropically etched. Instead, there may be a bulging out or under-etch condition in the polysilicon sidewall, such as shown at 32 in FIGS. 4 and 5 (as well as in the depicted results of prior art etching conditions shown in FIG. 3).

Therefore, in accordance with the most preferred embodiment of the invention, the main etch is carried out under the just described low pressure conditions, using either a mixture of Cl$_2$ and HBr etching gases, or preferably only Cl$_2$ gas as the etching gas in the main etching step; and then the over-etch conditions in the previously described embodiments are modified by the elimination of the flow of all etching gases into the etch chamber except HBr during the over-etch step.

However, as in the etch conditions previously described for the gas flow during the main etch in the other embodiments, the flow of carrier gases or additives, which are non-etching in nature, is not intended to be excluded by the recited use of only HBr as the etching gas in the over-etch step of this embodiment.

In accordance with this most preferred embodiment of the process of the invention, the flow of HBr etching gas into the etch chamber during the over-etch is maintained within a flow rate range equivalent to a flow of from about 30 sccm to about 60 sccm flowing into a 13 liter etch chamber.

Further, in accordance with this embodiment of the invention, the pressure in the etch chamber during the over-etch is maintained within a range of from about 50 milliTorr to about 150 milliTorr, preferably within a range of from about 80 milliTorr to about 120 milliTorr, typically about 100 milliTorr.

The wafer temperature in this embodiment is maintained within the same temperature range as for the previously described main etch step embodiments, i.e., with a temperature range of from about 18° C. to about 100° C., preferably higher than 40° C. up to about 75° C., and usually about 65° C., by appropriate heating or cooling of the wafer support on which the wafer is mounted during the etch steps.

In this embodiment, the plasma power range during the over-etch step of the process of the invention is maintained within a range, equivalent to a range for a 13 liter chamber, of from about 75 watts to about 200 watts, while the optional magnetic field strength is maintained within a range of from 0 to about 125 gauss, and preferably within a range of from about 30 gauss to about 125 gauss.

The time period for the over-etch for this embodiment will range from about 40 seconds to about 150 seconds. However, longer time periods can be used if needed. It should be noted, in this regard, that due to the much higher selectivity of the over-etch than the main etch, extension of the maximum overetch time period is not nearly as critical as in the main etch step.

FIG. 6 shows the results obtained when the structure of FIG. 1 is first etched in accordance with the previously described low pressure main etch conditions, preferably in the absence of HBr in the gas flow, to eliminate etch residues; and using the just described over-etch conditions of this most preferred embodiment of the invention wherein only HBr, as the etching gas, is flowed into the etch chamber. It will be noted that utilizing this embodiment of the process of the invention, both the silicide and polysilicon layers are anisotropically etched with no sign of either undercutting of the silicide layer or bulging out of the polysilicon layer, and no etch residues remaining on the surface of the wafer in the etched areas.

Thus, the invention provides an improved process for the anisotropic etching of titanium silicide or tantalum silicide layers, without observable undercutting of the silicide layer beneath the etch mask, using a low pressure Cl$_2$ main etch with optional use of HBr. In a preferred embodiment, to ensure removal or elimination of etch residues, only Cl$_2$ is used as the etching gas in the low pressure main etch step. In the most preferred embodiment, the over-etch step, which follows the low pressure main etch step of the invention, is also modified to eliminate all etch gases except for HBr to provide improved anisotropicity in the etched sidewalls of the polysilicon layer underlying the etched silicide layer.

Having thus described the invention, what is claimed is:

1. A two step etch process for the anisotropic plasma etching of an integrated circuit structure comprising a masked titanium silicide or tantalum silicide layer and an underlying polysilicon layer formed over a silicon oxide layer on a semiconductor wafer which comprises:
   a) anisotropically plasma etching the structure in a vacuum chamber maintained at a low pressure of from about 10 to about 30 milliTorr in a first etching step while flowing Cl$_2$ int the chamber as the sole etching gas to anisotropically etch said silicide layer and at least a portion of said polysilicon layer using a plasma generated between a cathode in said chamber and a grounded portion of said chamber; and b) further plasma etching said structure in said vacuum chamber during a second etching step while flowing HBr into said chamber as the sole etching gas to anisotropically etch remaining portions of said polysilicon layer.

2. The etch process of claim 1 wherein said $Cl_2$ etch gas is flowed into said vacuum chamber during said first etch step at a flow rate equivalent to from about 20 sccm to about 40 sccm into a 13 liter chamber.

3. The etch process of claim 1 wherein said semiconductor wafer in said vacuum chamber is optionally immersed in a magnetic field parallel to the plane of said wafer having a magnetic field strength ranging from 0 to about 125 gauss during said first and second etch steps.

4. The etch process of claim 1 wherein said wafer is maintained at a temperature ranging from about 10° C. to about 100° C. during said first etch step.

5. The etch process of claim 1 wherein said silicide layer is etched by said low pressure etch during said first etch step for a period of from about 30 to about 90 seconds.

6. The etch process of claim 1 wherein said first step of anisotropically etching said silicide layer and said underlying polysilicon layer on said wafer further comprises etching said structure for from about 30 to about 90 seconds in said vacuum chamber using said plasma maintained between said cathode and said grounded portion of said chamber at a power level equivalent to from about 200 watts to about 400 watts in a 13 liter chamber, while flowing said $Cl_2$ gas into said chamber as said sole etch gas during said first etch step at a rate equivalent to a rate of from about 20 sccm to about 40 sccm into a 13 liter chamber, while maintaining said wafer at a temperature of from about 18° C. to about 100° C., and optionally immersing said wafer in a magnetic field which is parallel to the plane of the wafer and which has a magnetic field strength ranging from 0 to about 125 gauss.

7. The etch process of claim 1 wherein said second etch step is carried out while maintaining the pressure in said vacuum chamber within a range of from about 50 milliTorr to about 150 milliTorr, the wafer temperature within a range of from about 18° C. to about 100° C., while maintaining said plasma in said chamber between said cathode and said grounded portion of said chamber within a power range equivalent of from about 75 watts to about 200 watts in a 13 liter chamber, and while optionally immersing said wafer in a magnetic field parallel to the plane of said wafer having a magnetic field strength ranging from 0 to about 125 gauss, with the flow rate of said HBr into said chamber, as said sole etch gas, being equivalent to a flow rate ranging from about 30 sccm to about 60 sccm into a 13 liter chamber.

8. A two step etch process for the anisotropic etching, in a vacuum chamber, of a masked titanium silicide or tantalum silicide layer and an underlying polysilicon layer formed over a silicon oxide layer on a semiconductor wafer on a cathode wafer support in said chamber which comprises:

a) anisotropically etching said silicide layer and a portion of said underlying polysilicon layer on said wafer in a low pressure first etch step for from about 30 to about 90 seconds in a vacuum chamber maintained at a pressure of from about 10 to about 30 milliTorr, using a plasma formed between said cathode wafer support and the grounded walls of said chamber and maintained at a power level equivalent to from about 200 watts to about 400 watts in a 13 liter chamber, while flowing $Cl_2$ gas into said chamber as the sole etch gas at a rate equivalent to form about 20 sccm to about 40 sccm into a 13 liter chamber, while maintaining said wafer at a temperature of from about 18° C. to about 100° C, and optionally immersing said wafer in a magnetic field parallel to the plane of the wafer and having a magnetic field strength ranging from 0 to about 125 gauss; and b) further etching said wafer in a second etch step using HBr as the sole etch gas to anisotropically etch said polysilicon layer while inhibiting the etching of said silicon oxide beneath said polysilicon layer on said wafer.

9. The etch process of claim 8 wherein said second etch step is carried out while maintaining the pressure in said vacuum chamber within a range of from about 50 milliTorr to about 150 milliTorr, the wafer temperature within a range of from about 18° C. to about 100° C., said plasma in said chamber between said cathode wafer support and said grounded walls of said chamber within a power range equivalent to from about 75 watts to about 200 watts in a 13 liter chamber, and while optionally immersing said wafer in a magnetic field parallel to the plane of said wafer having a magnetic field strength ranging from 0 to about 125 gauss, with the flow rate of said HBr into said chamber equivalent to a flow ranging from bout 30 sccm to about 60 sccm flowing into a 13 liter chamber.

* * * * *